United States Patent [19]

Kawai

[11] Patent Number: 4,754,215

[45] Date of Patent: Jun. 28, 1988

[54] SELF-DIAGNOSABLE INTEGRATED CIRCUIT DEVICE CAPABLE OF TESTING SEQUENTIAL CIRCUIT ELEMENTS

[75] Inventor: Masato Kawai, Tokyo, Japan

[73] Assignee: NEC Corporation, Tokyo, Japan

[21] Appl. No.: 927,038

[22] Filed: Nov. 5, 1986

[30] Foreign Application Priority Data

Nov. 6, 1985 [JP] Japan .................... 60-247151

[51] Int. Cl.$^4$ .................................. G01R 31/28
[52] U.S. Cl. ........................ 324/73 R; 324/73 AT; 371/15; 371/27
[58] Field of Search .................... 371/15, 25, 27; 364/737; 324/73 R, 73 AT

[56] References Cited

U.S. PATENT DOCUMENTS

| | | | |
|---|---|---|---|
| 4,329,640 | 5/1982 | Reiner et al. | 324/73 R |
| 4,471,484 | 9/1984 | Sedmak | 371/27 |

FOREIGN PATENT DOCUMENTS

| | | | |
|---|---|---|---|
| 0076854 | 6/1981 | Japan | 371/15 |
| 0103046 | 6/1983 | Japan | 371/15 |
| 0127244 | 7/1983 | Japan | 371/15 |
| 60-68624 | 4/1985 | Japan | |
| 0148138 | 8/1985 | Japan | 324/73 R |

Primary Examiner—Reinhard J. Eisenzopf
Assistant Examiner—W. Burns
Attorney, Agent, or Firm—Sughrue, Mion, Zinn, Macpeak, and Seas

[57] ABSTRACT

In a self-diagnosable integrated circuit device comprising sequential circuit elements in an internal logic circuit, a first test pattern signal is successively produced in a test mode from a test pattern generating circuit and stored into the sequential circuit elements with a first timing signal given from a timing signal generating circuit to the internal logic circuit. After storage of the first test pattern signal into the sequential circuit elements, a second test pattern signal is produced from the test pattern generating circuit with a second timing signal given to the internal logic circuit. The internal logic circuit carries out processing operations determined for the second timing signal and produces an output data signal which is dependent on the first and the second test pattern signals and which is evaluated by an external circuit. Storage of the first test pattern signal may be made by forming a scan path through a gate circuit connected to each sequential circuit element. Alternatively, each sequential circuit element may be loaded with the first test pattern signal by assigning addresses to the respective sequential circuit elements and by indicating each address.

4 Claims, 2 Drawing Sheets

SELF-DIAGNOSABLE INTEGRATED CIRCUIT DEVICE CAPABLE OF TESTING SEQUENTIAL CIRCUIT ELEMENTS

BACKGROUND OF THE INVENTION

This invention relates to a self-diagnosable integrated circuit device which is capable of diagnosing an internal logic circuit included in the self-diagnosable integrated circuit device.

In general, an integrated circuit device comprises a plurality of circuit elements which are classified into combinational circuit elements, such as AND gates and/or OR gates and sequential circuit elements, such as flip-flops, registers, and/or memories. The integrated circuit device carries out desired processing operations on an input data signal by the use of such circuit elements. It is a recent trend that the circuit elements included in the integrated circuit device remarkably increase in number with development of an integrated circuit technique. Under the circumstances, it becomes necessary to faithfully assure a quality of the integrated circuit device and to locate a fault when the integrated circuit device is faulty. For this purpose, a test must be made to diagnose the integrated circuit device on designing and manufacturing the same. Such a test is also often made when such an integrated circuit device is used in customers.

In Unexamined Japanese Patent Publication No. Syo 60-68,624, namely, 68,624/1985, a self-diagnosable integrated circuit device is proposed by S. Seibu and comprises an internal logic circuit operable as a gate array or the like and a test circuit united with the internal logic circuit to diagnose the internal logic circuit. With this structure, it is readily possible to test and evaluate the internal logic circuit by the use of the test circuit.

More particularly, the self-diagnosable integrated circuit device is operable in a normal mode and a test mode. In the normal mode, the internal logic circuit carries out processing operations on an input data signal in accordance with control signals.

In the test mode, an internal test pattern signal is processed in lieu of the input data signal in response to an internal timing signal determined for each control signal. Thus, external signals, such as the input data signal and the control signal, are not given from an external circuit to the self-diagnosable integrated circuit device in the test mode. At any rate, each processing operation can be carried out inside the self-diagnosable integrated circuit by the use of the internal test pattern signal and the internal timing signal. As a result, it is possible to diagnose and evaluate the internal logic circuit at every processing operation and to locate a fault in the internal logic circuit with a high reliability.

However, no consideration is directed to a self-diagnosable integrated circuit device including complicated sequential circuit elements. This means that a complete test can not be expected when such complicated sequential circuit elements are included in the self-diagnosable integrated circuit device. More specifically, it is assumed that the internal logic circuit comprises, as the sequential circuit elements, an internal memory for storing data signals and that a certain processing operation is carried out by the use of both the stored data signal or signals and a following data signal. Let such a self-diagnosable integrated circuit device be tested by the use of the internal test pattern signal and the internal timing signal in the above-mentioned manner. In this event, no stored data signal is definite in the internal memory when the internal test pattern signal and the internal timing signal are generated in the test circuit of the self-diagnosable integrated circuit device. Therefore, it is difficult to completely predict and estimate an output data signal which is to be produced from the self-diagnosable integrated circuit device in response to the internal test pattern signal and the internal timing signal.

On the other hand, it is possible to diagnose sequential circuit elements by handling the sequential circuit elements as a shift register string in a known manner. However, such sequential circuit elements are never tested in relation to a control signal determined for processing operations of an internal logic circuit.

SUMMARY OF THE INVENTION

It is an object of this invention to provide a self-diagnosable integrated circuit device which is capable of readily testing an internal logic circuit even when the internal logic circuit comprises a complicated logic circuit.

It is another object of this invention to provide a self-diagnosable integrated circuit device of the type described, which can effectively diagnose the internal logic circuit including a sequential circuit.

According to this invention, a self-diagnosable integrated circuit device is selectively operable in a normal mode and a test mode. The device is self-diagnosable in the test mode and comprises an internal logic circuit which includes sequential circuit elements and which carries out processing operation in response to an internal input signal and an internal timing signal, a data input terminal for an input data signal, a control terminal to be supplied with a control signal indicative of the processing operations of the internal logic circuit, a mode signal terminal for a mode signal representative of either one of the normal and the test modes, test pattern generating means responsive to the mode signal for generating a first and a second test pattern signal determined for the sequential circuit elements and the internal logic circuit, respectively, first selecting means coupled to the data input terminal and the test pattern generating means for selecting the input data signal and the second test pattern signal in the normal and the test modes, respectively, to produce a first selected signal, first signal supplying means for supplying the first selected signal to the internal logic circuit as the internal input signal, timing signal generating means responsive to the mode signal for generating a first and a second timing signal determined in relation to the sequential circuit elements and the control signal, respectively, when the mode signal is indicative of the test mode, second selecting means coupled to the control terminal and the timing signal generating means for selecting the control signal and the second timing signal in the normal and the test modes, respectively, to produce a second selected signal, second signal supplying means for supplying the second selected signal to the internal logic circuit as the internal timing signal, and assigning means in the internal logic circuit for assigning the first test pattern signal to the sequential circuit elements in response to the first timing signal in the test mode.

DESCRIPTION OF THE PREFERRED EMBODIMENT

Figure 1:
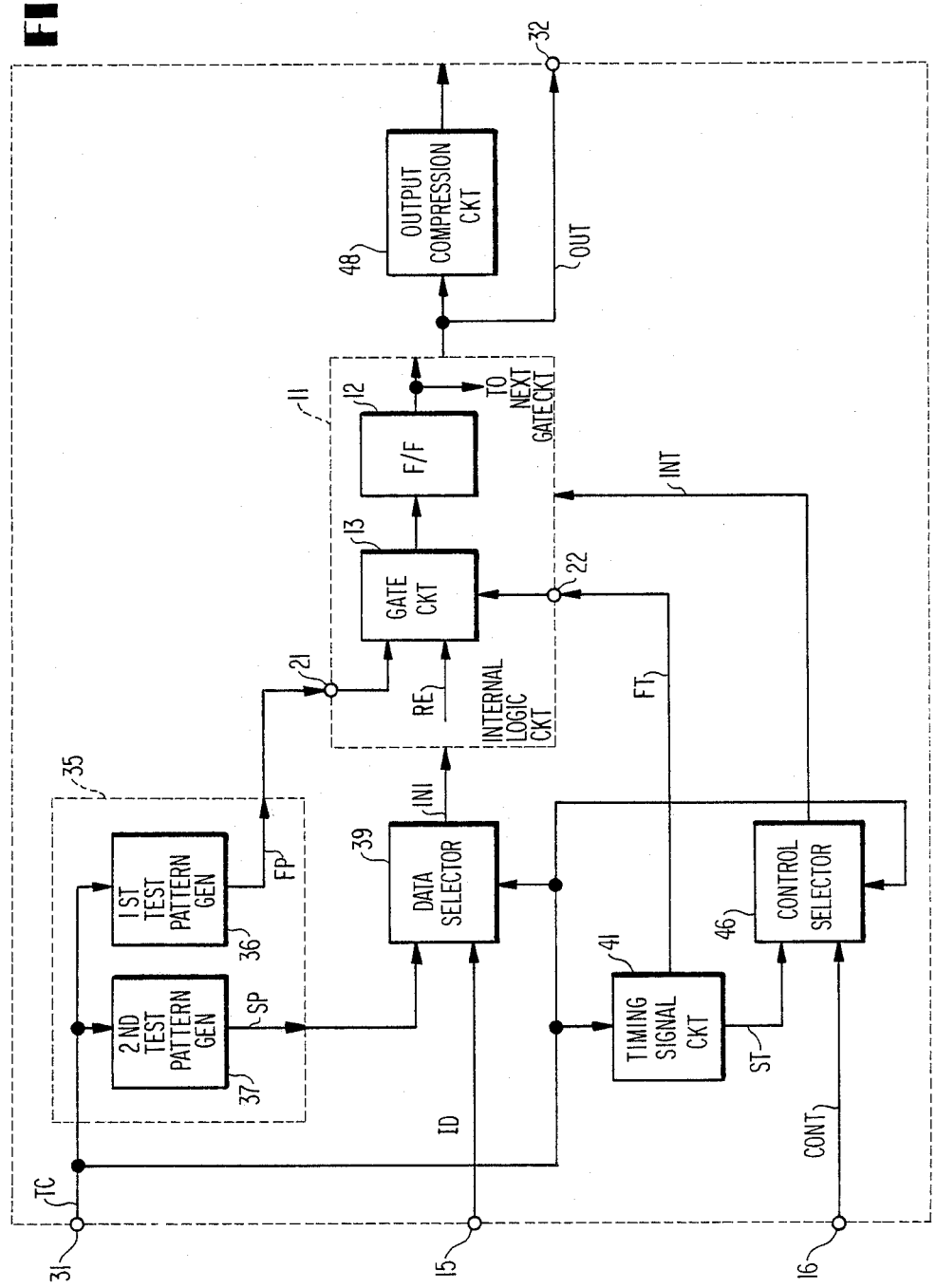
FIG. 1 is a block diagram of a self-diagnosable integrated circuit device according to a preferred embodiment of this invention.

Referring to FIG. 1, a self-diagnosable integrated circuit device according to a preferred embodiment of this invention is operable in a normal mode and a test mode and comprises an internal logic circuit 11. The internal logic circuit 11 includes a great number of circuit elements, such as combinational circuit elements and sequential circuit elements, although a single flip-flop 12 alone is illustrated in FIG. 1 as a representative of the circuit elements and is combined with a gate circuit 13 as will later be described in detail.

In the normal mode, the internal logic circuit 11 carries out processing operations which are predetermined therefor and which may be, for example, addition, subtraction, multiplication, division, read-out operation, and/or write-in operation. The write-in and the read-out operations may be related to the sequential circuit elements, for example, a memory included in the internal logic circuit 11. At any rate, the processing operations may be progressive by accessing data signals stored in the sequential circuit elements and are carried out in response to an internal input signal INI and an internal timing signal INT. In the normal mode, the internal input signal INI is an input data signal ID supplied through a data input terminal 15 from an external circuit (not shown) while the internal timing signal INT is a control signal CONT supplied through a control terminal 16 from the external circuit. The control signal CONT is determined for the processing operations.

In the test mode, the illustrated circuit device can test the sequential circuit elements and the combinational circuit elements of the internal logic circuit 11 in a manner to be described. In order to make it possible to test the sequential circuit elements, the gate circuit 13 is connected to each sequential circuit element, namely, flip-flop 12, as illustrated in FIG. 1.

In short, the sequential circuit elements are tested by forming a shift register string or a scan path and by successively storing a test pattern signal into the shift register string in accordance with a sequence of clock pulses (not shown). The test pattern signal may be called a first test pattern signal FP while the scan timing signal may be called a first timing signal FT. The first test pattern signal FP is divisible into bit signals of a number determined by the sequential circuit elements.

Figure 2:
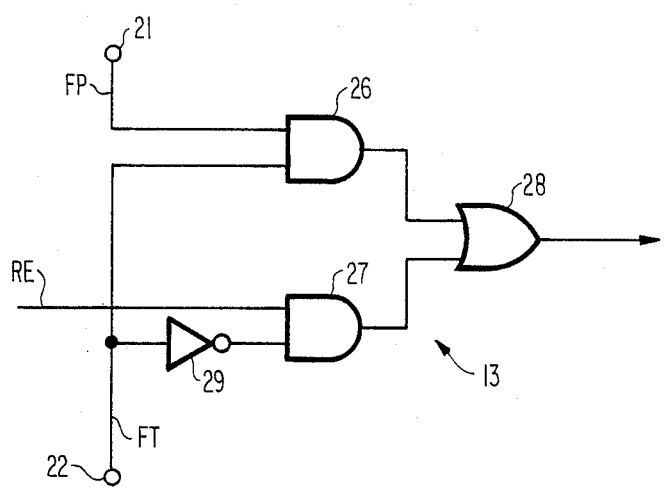
FIG. 2 is a circuit diagram of a part of the circuit device illustrated in FIG. 1.

Referring to FIG. 2 together with FIG. 1, the internal logic circuit 11 has a test pattern input terminal 21 and a test control terminal 22. The test pattern input terminal 21 and the test control terminal 22 are supplied with the first test pattern signal FP and the first timing signal FT in the test mode, respectively. In FIG. 2, the gate circuit 13 comprises a first AND gate 26, a second AND gate 27, an OR gate 28, and an inverter 29. The first AND gate 26 is given the first test pattern signal FP and the first timing signal FT while the second AND gate 27 is supplied with the first timing signal FT through the inverter 29 and with a result signal RE. The result signal RE is representative of a result of processing in one of the combinational circuit that is connected to the gate circuit 13 in question.

Inasmuch as the first timing signal FT takes a logic "1" level on testing the sequential circuits, the first test pattern signal FP is sent through the first AND gate 26 and the OR gate 28 to the flip-flop 12. The flip-flop 12 is connected in series to the next following gate circuit (not shown) through connections between the flip-flop 12 and the gate circuit 13 to form the scan path on testing the sequential circuit elements in a known manner. Under the circumstances, the first test pattern signal FP is successively shifted to the next following flip-flop (not shown). Thus, the internal logic circuit 11 is operable in a scan path mode of operation when the sequential circuit elements are tested in the internal logic circuit 11. A combination of the gate circuit 13 and the connections between the gate circuit 13 and the following flip-flop 12 may serve to assign the first test pattern signal FP to the respective flip-flops. The connections may be called a transferring circuit for transferring the first test pattern signal.

On the other hand, the result signal RE is stored into the flip-flop 12 through the second AND gate 27 and the OR gate 28 when the first timing signal FT takes a logic "0" level.

Referring back to FIG. 1, the illustrated circuit device has a mode signal terminal 31 for a test command signal TC which is representative of a selected one of the normal mode and the test mode and which will therefore be referred to as a mode signal. In the example being illustrated, the test command signal, namely, mode signal TC takes the logic "1" level when the test mode is indicated. Otherwise, the mode signal TC takes the logic "0" level.

The self-diagnosable integrated circuit device further has an output terminal 32 for supplying the external circuit with an output data signal OUT which is produced as a result of calculation in the internal logic circuit 11.

In FIG. 1, the mode signal TC is delivered to a test pattern circuit 35 which comprises a first test pattern generator 36 and a second test pattern generator 37. The first test pattern generator 36 may be, for example, a pseudo random number generator comprising a plurality of flip-flops and a plurality of Exclusive OR gates connected in the known manner. The first test pattern generator 36 generates the first test pattern signal FP determined for the shift register string which has bits of a number equal to the number of the sequential circuit elements. The first test pattern signal FP is delivered to the internal logic circuit 11 through the test pattern input terminal 21 and is successively stored in the sequential circuit elements through the scan path in the scan path mode. Such a storing operation is known in the art and will not be described any longer.

The second test pattern generator 37 generates a second test pattern signal SP determined for the internal logic circuit 11 and, in particular, for the combinational circuit elements of the internal logic circuit 11. The second test pattern generator 37 may also be a pseudo random number generator which is constituted by a combination of flip-flops and Exclusive OR gates and which may be referred to as a linear feedback shift register.

Inasmuch as the first and the second test pattern generators 36 and 37 are thus constituted by pseudo random number generators, each of the first and the second test pattern signals FP and SP can be previously predicted and reproduced when structure of each generator is determined together with an initial state set in each generator. This means that it is possible to predict the output data signal OUT appearing in response to the first and the second test pattern signals FP and SP.

The first and the second test pattern signals FP and SP may be continuously produced in the normal mode, if the initial state is determined in the test mode.

The second test pattern signal SP is delivered to a data selector 39 which is supplied with the input data signal ID through the data input terminal 15 and which may be called a first selector. In the illustrated example, the data selector 39 is given the mode signal TC through the mode signal terminal 31 and selects either the input data signal ID or the second test pattern signal SP as a first selected signal in response to the mode signal TC. Specifically, the input data signal ID is selected by the data selector 39 and supplied to the internal logic circuit 11 as the first selected signal when the mode signal TC takes the logic "0" level and is representative of the normal mode. On the other hand, the second test pattern signal SP is selected by the data selector 39 to be supplied as the first selected signal to the internal logic circuit 11 when the test mode is indicated by the mode signal TC. Anyway, the first selected signal is sent to the internal logic circuit 11 as the internal input signal INI. A connection between the data selector 39 and the internal logic circuit 11 serves as a supply circuit for supplying the first selected signal to the internal logic circuit 11 as the internal input signal INI.

Figure 3:
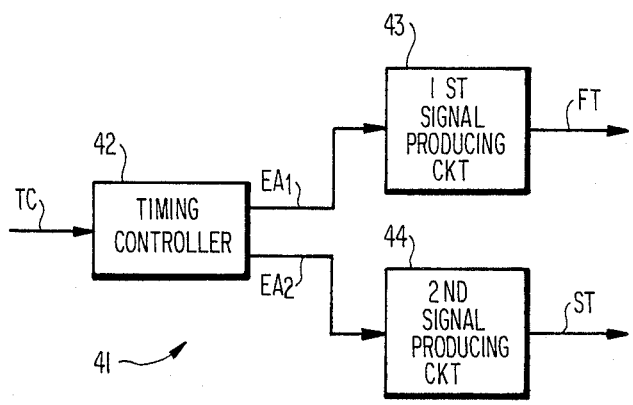
FIG. 3 is a block diagram of another part of the circuit device illustrated in FIG. 1.

Referring to FIG. 3 together with FIG. 1, a timing signal generator 41 is energized when the test mode is indicated by the logic "1" level of the mode signal TC. Otherwise, the timing signal generator 41 is deenergized in the normal mode. In the test mode, the timing controller 42 at first delivers a first enable signal $EA_1$ to a first signal producing circuit 43. Responsive to the first enable signal $EA_1$, the first signal producing circuit 43 supplies the internal logic circuit 11 with the first timing signal FT. The first timing signal FT takes the logic "1" level while the first enable signal $EA_1$ is given from the timing controller 42 to the first signal producing circuit 43. As a result, the internal logic circuit 11 is put into the scan path mode and the sequential circuit elements are successively loaded with the first test pattern signal FP bit by bit in timed relation to the clock pulse sequence.

The timing controller 42 times a predetermined duration after reception of the logic "1" level of the mode signal TC and delivers a second enable signal $EA_2$ to the second signal producing circuit 44 after lapse of the predetermined duration. The predetermined duration is therefore determined in relation to a length of the scan path.

Responsive to the second enable signal $EA_2$, the second signal producing circuit 44 produces a second timing signal ST determined in relation to the processing operations of the internal logic circuit 11. The second timing signal ST may therefore be made to correspond to the control signal CONT and may comprise a wide variety of control pulses which are successively sent from the second signal producing circuit 44 one by one. Such a second signal producing circuit 44 can be constituted by a combination of a counter and a read-only memory (ROM).

In FIG. 1, a control selector 46 is supplied with the control signal CONT, the second timing signal ST, and the mode signal TC and selects either the control signal CONT or the second timing signal ST as a second selected signal in accordance with the mode signal TC. Specifically, the control signal CONT is selected as the second selected signal in the normal mode while the second timing signal ST is selected as the second selected signal in the test mode. The second selected signal is supplied as the internal timing signal to the internal logic circuit 11 through a connection between the control selector 46 and the internal logic circuit 11. Therefore, the connection may be called a supply circuit for supplying the second selected signal to the internal logic circuit 11 as the internal timing signal INT.

Thus, the internal logic circuit 11 is operable in response to the control signal in the normal mode and in response to the second timing signal ST in the test mode after the sequential circuit elements are loaded with the first test pattern signal FP in the scan path mode. From this fact, it is seen that the test mode is divisible into the scan path mode and the following mode which may be called a non-scan path mode or a logic test mode of operation.

In either the normal mode or the logic test mode, the output data signal OUT is sent to the output terminal 32 and to an output compression circuit 48 energized only in the test mode. The output compression circuit 48 may be a signature register which comprises a plurality of flip-flops and a plurality of Exclusive OR gates and which serves to produce a specific pattern in response to the first and the second test pattern signals FP and SP. The signature register 48 is known in the art and will not be described any longer.

Now, description will be directed to operation of the illustrated self-diagnosable integrated circuit device.

In the normal mode, the input data signal ID is supplied from the data input terminal 15 to the internal logic circuit 11 through the data selector 39 as the internal input signal INI. The control signal CONT is supplied from the control terminal 16 to the internal logic circrit 11 through the control selector 46 as the internal timing signal INT. The internal logic circuit 11 successively carries out the processing operations indicated by the control signal CONT to process the input data signa ID. As a result, the output data signal OUT appears at the output terminal 32.

In the test mode, the mode signal TC takes the logic "1" level to put the first test pattern generator 36 into the initial state. Concurrently, the timing signal generator 41 renders the first timing signal FT into the logic "1" level. Responsive to the mode signal TC of the logic "1" level, the data selector 39 suppresses the input data signal ID to select the second test pattern signal SP. Likewise, the control selector 46 suppresses the control signal CONT to select the second timing signal ST.

Under the circumstances, the sequential circuit elements of the internal logic circuit 11 forms the scan path in a known manner and are therefore operable as the shift register string. The first test pattern signal FP is successively stored in each of the sequential circuit elements through the scan path. After storage of the first test pattern signal FP into the sequential circuit elements, the first timing signal FT is rendered into the logic "0" level to operate the internal logic circuit 11 into the logic test mode which is identical with the normal mode.

In the logic test mode, the scan path is cut into individual sequential circuit elements in the manner described in conjunction with FIG. 2 to carry out inherent operations of the individual sequential circuit elements. Thus, each of the sequential circuit elements is separated from one another. In this event, the second test pattern signal SP and the second test signal ST are delivered through the data selector 39 and the control selector 16 to the internal logic circuit 11 as the internal input signal INI and the internal timing signal INT, respectively.

As mentioned before, the internal logic circuit 11 is put into the logic test mode identical with the normal mode and the second timing signal ST is determined in relation to the control signal CONT. In the logic test mode, the internal logic circuit 11 can therefore simulate the processing operations carried out in accordance with the control signal CONT. Each processing operation is variable by changing the control pulses of the second timing signal ST. The resultant output data signal OUT appears at the output terminal 32.

If the output data signal OUT is directly used to diagnose the internal logic circuit 11, comparison is made between the output data signal OUT and a predictive value determined for the output data signal OUT. Thus, it is judged whether the internal logic circuit 11 is normal or not.

If the output data signal OUT consists of a great number of digital signals, the output compression circuit 48 restricts the output data signal OUT into a restricted data signal of the specific pattern. The diagnosis is made by the use of the restricted data signal. That is, judgement is made whether or not the specific pattern is coincident or not.

After no fault is found as a result of the diagnosis, the mode signal TC is turned into the logic "0" level to make the data selector 39 and the control selector 46 select the input data signal ID and the control signal CONT, respectively.

Although the data selector 39 and the control selector 46 are controlled by the mode signal TC in the illustrated device, they may be controlled by the timing signal circuit 41.

Similar operations may be succesively carried out in the self-diagnosable integrated circuit device. For example, once a diagnosis of the internal logic circuit is finished by the first and the second test pattern signals FP and SP, the first test pattern signal FP may be changed to a new one to be stored into the sequential circuit elements and to make the internal logic circuit 11 carry out similar processing operations by the new one of the first test pattern signal FP. In other words, storage of different ones of the first test pattern signal FP and similar processing operations may be repeated several times. In this event, it is possible to rewrite or refresh previous contents of the sequential circuit elements, in particular, a memory into optimum contents when the previous contents are not effective for a diagnosis. This enables an effective diagnosis.

While this invention has thus far been described in conjunction with a single preferred embodiment thereof, it will readily be possible for those skilled in the art to put this invention into practice in various other manners. For example, the sequential circuit elements may be loaded with the first test pattern signal FP without any formation of the scan path. For instance, the first test pattern signal FP can be stored in the sequential circuit elements by assigning a sequence of addresses to the sequential circuit elements and by indicating the respective addresses in which the first test pattern signal is stored. To this end, the addresses may be produced from the timing signal circuit 41 instead of the first timing signal FT while the first test pattern signal FP may be given in common to all of the sequential circuit elements.

What is claimed is:

1. A self-diagnosable integrated circuit device selectively operable in a normal mode and a test mode, said device being self-diagnosable in said test mode and comprising:

an internal logic circuit which includes sequential circuit elements and non-sequential circuit elements and which carries out processing operations by the use of said sequential and said non-sequential circuit elements in response to an internal input signal and an internal timing signal;

a data input terminal for an input data signal;

a control terminal for a control signal indicative of said processing operations;

a mode signal terminal for a mode signal representative of a selected one of said normal and said test modes;

test pattern generating means responsive to said mode signal for generating a first and a second test pattern signal determined for said sequential circuit elements and said processing operations of said internal logic circuit, respectively;

first selecting means coupled to said data input terminal and said test pattern generating means for selecting said input data signal and said second test pattern signal in said normal and said test modes, respectively, to produce a first selected signal;

first signal supplying means for supplying said first selected signal to said internal logic circuit as said internal input signal;

timing signal generating means responsive to said mode signal for generating a first and a second timing signal determined in relation to said sequential circuit elements and said control signal, respectively, when said mode signal is indicative of said test mode;

second selecting means coupled to said control terminal and said timing signal generating means for selecting said control signal and said second timing signal in said normal and said test modes, respectively, to produce a second selected signal;

second signal supplying means for supplying said second selected signal to said internal logic circuit as said internal timing signal; and assigning means in said internal logic circuit for assigning said first test pattern signal to said sequential circuit elements in response to said first timing signal in said test mode.

2. A self-diagnosable integrated circuit device as claimed in claim 1, wherein said test pattern generating means comprises:

a first pattern generator responsive to said mode signal for generating said first test pattern signal; and a second pattern generator responsive to said mode signal for generating said second test pattern signal.

3. A self-diagnosable integrated circuit device as claimed in claim 1, wherein said timing signal generating means comprises:

enable signal producing means responsive to said mode signal for producing a first enable signal and a second enable signal following said first enable signal when said mode signal is representative of said test mode;

first generating means responsive to said first enable signal for generating said first timing signal; and second generating means responsive to said second enable signal for generating said second timing signal.

4. A self-diagnosable integrated circuit device as claimed in claim 1, wherein said assigning means comprises:
- gate means responsive to said first test pattern signal and said first timing signal for sending said first test pattern signal to said sequential circuit elements only when said first timing signal is present; and
- means for successively transferring said first test pattern signal to said sequential circuit elements to assign said first test pattern signal thereto.

* * * * *